United States Patent [19]

Birge et al.

[11] Patent Number: 5,228,001
[45] Date of Patent: Jul. 13, 1993

[54] OPTICAL RANDOM ACCESS MEMORY

[75] Inventors: Robert R. Birge, Manlius, N.Y.; Albert F. Lawrence, San Diego, Calif.

[73] Assignee: Syracuse University, Syracuse, N.Y.

[21] Appl. No.: 644,500

[22] Filed: Jan. 23, 1991

[51] Int. Cl.⁵ .............................................. G11C 13/04
[52] U.S. Cl. .................................. 365/215; 365/112; 365/234
[58] Field of Search ............... 365/215, 234, 112, 124, 365/125

[56] References Cited

U.S. PATENT DOCUMENTS

| | | | |
|---|---|---|---|
| 3,518,634 | 6/1970 | Ballman et al. | 365/215 X |
| 3,720,921 | 3/1973 | Schools et al. | 343/173 M |
| 3,833,894 | 9/1974 | Aviram et al. | 349/173 R |
| 3,851,318 | 11/1974 | Taylor et al. | 365/215 X |
| 3,902,175 | 8/1975 | Winzer | 365/215 X |
| 3,977,009 | 8/1976 | Ohtsuka et al. | 386/75 R |
| 4,434,477 | 2/1984 | Sander et al. | 365/124 X |
| 4,633,445 | 12/1986 | Sprague | 365/215 X |
| 4,649,518 | 3/1987 | Sadjian | 365/119 |
| 4,713,795 | 12/1987 | Waike et al. | 365/119 |
| 4,789,965 | 12/1988 | Michl et al. | 365/121 |

OTHER PUBLICATIONS

Robert R. Birge, A Spectroscopic, Photocalorimetric, and Theoretical, etc. 111 J. Am. Chem. Soc., 4063-1989.

Molecular Electronics, "Circuits and Devices a Molecular Wide" Mort La Brecque, vol. 20, No. 1 Spring 1989 pp. 16-27.

Molecular Electronics, "Devices that Assemble Themselves" Mort La Brecque, vol. 20, No. 1 Spring 1989 pp. 28-33.

Primary Examiner—Eugene R. LaRoche
Assistant Examiner—Do Hyun Yoo
Attorney, Agent, or Firm—Wall and Roehrig

[57] ABSTRACT

An electro optical random access memory uses a film of bacteriorhodopsin or similar photochromic substance which can change between two light absorbing states in response to light of each of two wavelengths. In one embodiment combined red and green laser beams are steered in two orthogonal directions to memory locations on the film. The relative amounts of the light of the two wavelength reflected from memory cell is sensed and discriminated to indicate "1" or "0". A crowbar circuit holds one or the other of the two laser beams on to compensate for degradation that occurs in a read cycle. In another embodiment a single wavelength is employed for read and write operations, but at a much greater strength for the write operation.

7 Claims, 3 Drawing Sheets

OPTICAL RANDOM ACCESS MEMORY

BACKGROUND OF THE INVENTION

This invention relates to high-speed random access memory devices, and is more especially directed to an optical memory system in which light is employed to write and read data to and from memory cells of the systems. The invention is more particularly concerned with optical data storage systems in which the data can be written, stored, and read out non-destructively, or erased, as required, and which is capable of extremely rapid access, with process time on the order of picoseconds or faster.

A number of attempts have been made to produce a high-speed optical memory, i.e. one in which binary information is recorded and read out from a storage medium with a laser beam. For example, thin-film inorganic optical memories are discussed in U.S. Pat. No. 4,866,672, but these have drawbacks such as low crystalization speed, poor sensitivity, and inadequate reproduced-signal intensity.

Molecular-level data storage is described, e.g. in U.S. Pat. No. 4,032,901, in which a high-resolution scanning electron microscope is required to access the memory storage areas. The memory access time was rather high, on the order of ten nanoseconds to one microsecond.

U.S. Pat. No. 4,789,965 describes an optical data memory system that employs molecular pseudorotation, and discusses the possible use of photochromic materials in a memory device, where a color change would indicate the binary state. However, color gradients and variations in color intensity between "1" and "0" states have made it difficult to determine whether photochromic molecules were in one state or the other, and this ambiguity has severely limited practical applicability of such systems.

An optical switch for optically reading and writing data is described in U.S. Pat. No. 4,713,795. This system employs a nitroprusside medium, and also employs lasers of two different wavelengths, one for reading and the other for writing.

A frequency-selective optical memory is described in U.S. Pat. No. 3,896,420, which employs first and second optical oscillators, i.e., lasers, to write and read, respectively, using a crystal slab as a storage medium. These devices have not proved to be practicable for a number of reasons, among which is the need for extreme cryogenic conditions, i.e. operation at liquid helium temperature.

In recent years, attention has been focused on the potential use of light-transducing proteins to perform optical switching functions. These molecules, either in their native form, or as engineered compounds, obtained by genetic engineering or organic protein synthesis, have a number of attractive features including high speed and efficiency.

One such protein that has been studied is bacteriorhodopsin, which is the light-harvesting component of a halophilic microorganism *Halobacterium halobium*. This organism, which habitates salt marshes, grows this protein under conditions of oxygen deprivation, when the usual oxygen respiration route for synthesis of ATP from ADP becomes too inefficient to sustain growth. The bacteriorhodopsin molecule converts light energy into a hydrogen ion gradient that chemiosmotically drives the synthesis of ATP.

The photocycle of bacteriorhodopsin involves a ground state bR and a number of excited molecular states or photoproducts, K,M. At liquid nitrogen temperatures, e.g. 77 K, the bacteriorhodopsin molecule moves between its ground state bR and a primary photoproduct K, where red light ($\lambda=620$ nm) brings the ground-state molecule bR to the photoproduct K, and green light ($\lambda=576$ nm) operates to reverse this and returns the K photoproduct to the ground state bR. This is a high speed change of state, as the formation times associated with both the forward and reverse reactions are below five picoseconds.

At higher temperature (on the order of 200 K) there is photo-equilibrium coupling between the ground state bR and another excited mode M, where the formation times are moderately higher (on the order of 100 microsecond). In this case, the ground state molecule bR is photoreacted to the excited M state with green light ($\lambda=570$ nm) in the order of picoseconds. The M state reacts to blue light ($\lambda=412$ nm) to revert back to the bR state.

However, prior to this invention, no one has been able to employ bacteriorhodopsin in an optical switch, optical RAM, or other optical data storage device, and no one previously has appreciated the remarkable beneficial proprieties of long-term stability of the protein and its resistance to thermal and photochemical degradation; picosecond photochemical reaction times; high forward and reverse quantum yields that would permit use of low-light intensities for switching; wavelength-independent quantum yields; large shifts in the absorption spectrum characteristics that permit unambiguous and reproducible assignment of states; high two-photon cross-section for photoactivation which permits high storage density; and ability to form thin films with excellent optical properties.

No one in the art has previously appreciated the technological possibilities of an optical switch or memory device that employed bacteriorhodopsin or another photochromic medium, nor has anyone in the art proposed structure of a memory device that could successfully employ this protein or another photochromic molecule in a high speed random access memory device.

OBJECTS AND SUMMARY OF THE INVENTION

It is an object of this invention to provide a high-speed photochromic random access memory device which is reliable and efficient.

It is another object of this invention to provide a high-speed optical random access memory that can employ a laser of low to moderate power for write, read, and erase operations.

It is a further object of this invention to provide an optical random access memory in which the states of the data cells are maintained unambiguously for a large number of read cycles.

In accordance with one aspect of this invention, an electro-optical memory arrangement employs first and second lasers, e.g. a red laser ($\lambda=633$ nm) and a green laser ($\lambda=543$ nm), and first and second optical switches for selectively passing the light from the first and second lasers along an optical path that leads to a photochromic memory plate disposed across the optical path. The plate has a thin film of bacteriorhodopsin (or an equivalent photochromic material) that assumes one state i.e. "1", under influence of the light of the first laser, and a second complementary state, i.e. "0" under influence of the light of the second laser. An optical beam steering arrangement directs the beams of the lasers in orthogonal directions (e.g. X and Y) across the memory plate to selected memory cell locations where data are to be written or read. For a read cycle, the light continues along from the memory plate to a photodetector arrangement, where the red light that emanates from the first laser is converted to an output level and the green light that emanates from the second laser is converted to another output level. A differential read discriminator provides a binary "0" or "1" depending on the relative strengths of the two photodetectors output levels. The bacteriorhodopsin molecules have two distinct states: one (bR) which is red-absorbing and another (K) which is green-absorbing. If the molecule is in the green-absorbing state, it becomes red-absorbing when exposed to green light. If the molecule is in the red-absorbing state, it becomes green-absorbing when exposed to red light. This property permits the memory cells on the memory plate to act as bi-stable optical switches that store data in binary form.

In order to prevent the read cycle from degrading the state of the bacteriorhodopsin, a so-called crowbar circuit, which is controlled by the output of the discriminator, switches one of the optical switches on after a read cycle in response to the binary sense indicated by the discriminator so that the memory cells will be refreshed after a read cycle. That is, if the bacteriorhodopsin is in its red-absorbing state the crowbar circuit can actuate the second optical switch so that additional green light is illuminated onto the memory cell. On the other hand, if the bacteriorhodopsin is in its green-absorbing state, additional red light is illuminated onto the memory cell.

Preferably, the optical RAM is based on two photostationary states where the relative amount of each species bR and K indicates an associated binary state. While it is possible to produce nearly pure bR (green-absorbing) bacteriorhodopsin by using light in the wavelength band of 630 to 700 nm, the highest population of K (red-absorbing) bacteriorhodopsin that can be attained is about 44% using green light in the wavelength range 540 to 545 nm. Therefore, in this embodiment the two complementary photostationary states are state "0" and state "1" represented by 97% bR and by 56% bR/44% K, respectively, Because of the rather wide separation in relative densities in these two photostationary states, there is a very high signal to noise ratio for state assignment, (i.e., a low ambiguity) and the use of differential read techniques provides high-speed read capability with high reliability.

In order to maintain the stability of the K state, the bacteriorhodopsin film is kept at liquid nitrogen temperature (77 K). However, it is expected that with improvements in molecular engineering, other suitable photochromic agents will soon be found which will not be subject to the requirement for low temperature conditions.

Accordingly to another aspect of the invention, a "room temperature" electro-optical memory arrangement employs a laser of one predetermined wavelength (e.g. green light), and an optical switch for selectively passing light from the laser along a predetermined optical path. A photochromic memory plate is positioned across the optical path and has a film of bacteriorhodopsin, or an equivalent photochromic material, arranged into an array of memory cells in the X and Y directions. An optical beam steering arrangement directs the laser beam to selected memory cells in the X and Y direction, and light which emanates from the laser and is reflected off the plate (or passes through it) reaches a photodetector, whose output level indicates the state ("1" or "0") of the memory cell. A reset illumination lamp provides light of an appropriate wavelength (i.e., blue light) at sufficient strength to reset all of the memory cells to the "0" state (or green-absorbing bR state). For a write operation the laser beam is operated at a much greater strength—e.g., by a factor of 500—than for a read operation. For writing, the laser, which can be a HeNe laser, is used at full intensity, i.e. 1 mw. For reading the laser is used at 0.2% intensity, i.e., 2 w. The reset lamp, which can be a quartz-halogen lamp whose light is filtered through an interference filter (e.g., with a 400–420 nm pass band) exposes the bacteriorhodopsin film for a comparatively long period of time to reset the entire memory plate to the green-absorbing bR or "0" state.

The memory can be refreshed after some predetermined number of read cycles by resetting all the cells to the "0" (bR) state, and then by rewriting placing "1" in the "1" cells by exposing to the write laser beam to set them to the "1" (M) state In either of the above embodiments a memory array contains a predetermined number of the memory arrangements that are coupled in parallel, with the one of two lasers being coupled to each of the memory arrangements via a laser bus.

In either case, the memory is characterized by very short response times (on the order of picoseconds). Other data processing circuitry associated with this memory will have much longer delay and response times, and will dominate any queuing or waiting.

The above and other objects, features, and advantages of this invention will be more fully appreciated from the ensuring description of illustrative preferred embodiments, which are to be considered in connection with the accompanying Drawing.

DETAILED DESCRIPTION OF THE PREFERRED EMBODIMENT

Figure 1:
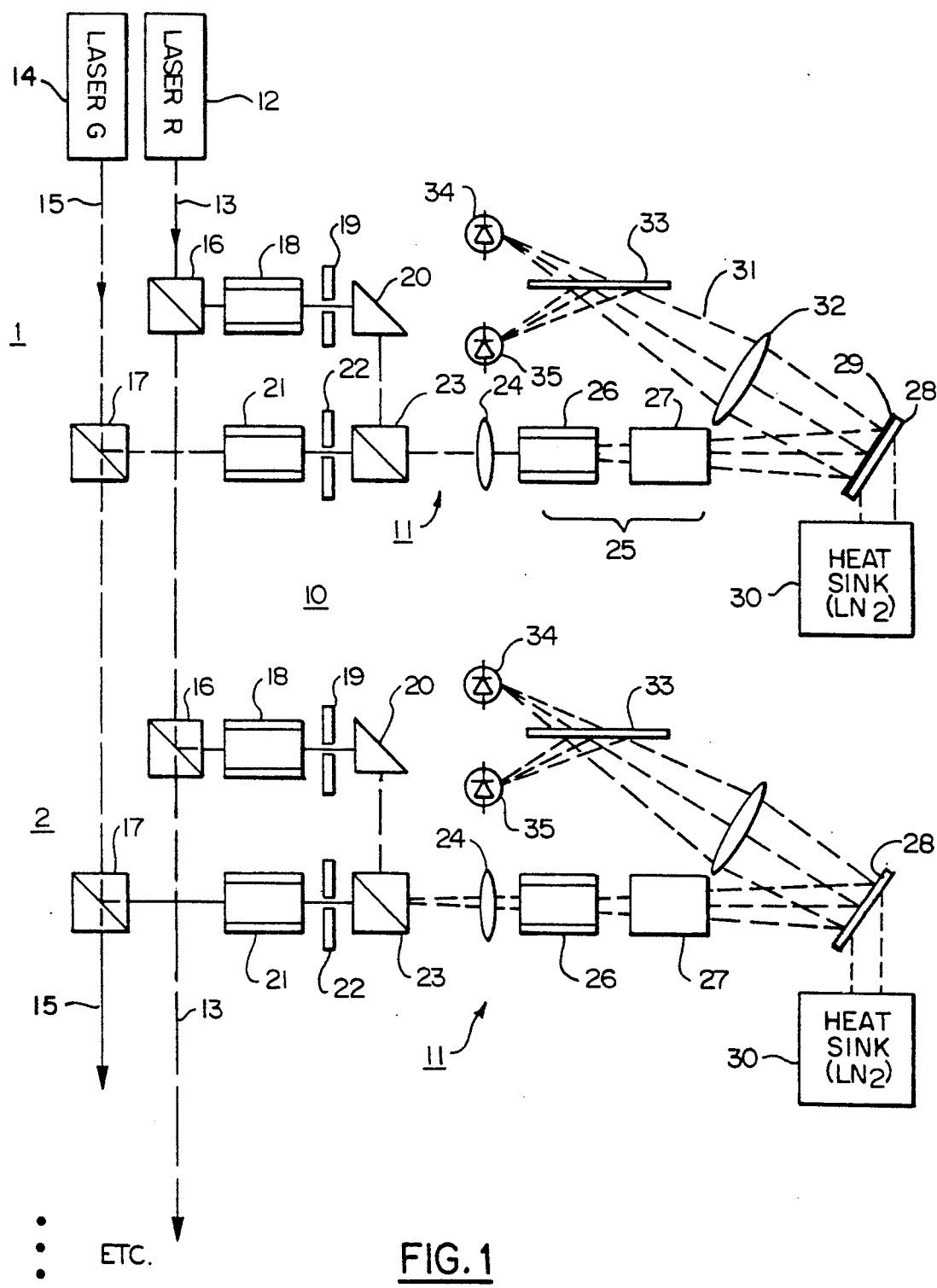
FIG. 1 is a schematic view of an optical memory arrangement according to one embodiment of this invention.

With reference to the Drawing, and initially to FIG. 1, an optical random access memory 10 is shown schematically to include plurality of individual memory units 11, each memory unit being responsible for a particular binary bit of a multi-bit word or byte. The memory units all share a red helium neon laser 12, which emits red light along an optical bus 13, and each of the memory units also shares a green helium neon laser 14, which emits light along a green optical bus 15. Each memory unit has a partially reflecting prism 16 that extracts a fraction of the light e.g. about one milliwatt, from the red optical bus 13, and directs it along an optical path. Similarly, another partially reflecting prism extracts a small amount of radiation i.e., one milliwatt, that is travelling along the optical bus 15, and directs this green light along another optical path. Following the prism 16, there is a high speed optical switch 18, an optical filter 19, and a reflector 20. Following the prism 17 there is another high speed optical switch 21, a filter 22, and a half-reflecting prism 23. This prism 23 combines the red and green light admitted by the two optical switches 18 and 21 into a single beam which is focused by a lens 24 and steered in two orthogonal directions by an optical beam steering arrangement 25. In this embodiment, the steering arrangement 25 includes a pair of electro-optical scanners 26 and 27 arranged successively, and disposed to deflect the combined red and green beam along Y and Z coordinate axes respectively.

Following the beam steering arrangement is disposed a photochromic memory formed of a flat reflecting plate 28 and a film 29 of a photochromic substance, e.g., bacteriorhodopsin. The film 29 is arranged as an array of memory cells distributed at addressable locations which can be reached by steering the beam by respective predetermined increments in the Y and Z directions. The film 29 can be spin coated onto the plate, or the film 29 can alternatively be a Langmuir-Blodgett film.

A heat sink 30 coupled to the plate 28 maintains the plate and film 29 substantially at liquid nitrogen temperature (i.e. 77 K).

When illuminated by the red or green light, the photochromic mirror provides a mirror reflected light beam 31 which is focused in a lens 32 and then passes to a dichroic reflector. Here, a photodiode 34 on one side of the reflector 33 receives red light from the photochromic mirror, and another photodiode 35 on the other side of the dichroic reflector 33 receives reflected green light. The relative signal strengths from the two diodes 34 and 35 are discriminated to ascertain whether an individual memory cell being probed by the light beam has a "1" or a "0" sense.

In this embodiment, the photochromic mirror 28 is a flat reflective plate, but in other embodiments, a spherical or parabolic reflector could be employed. In still other embodiments, the plate 28 could be transparent with the dichroic reflector 33 and with the photodiodes 34 and 35 situated behind it.

Figure 2:
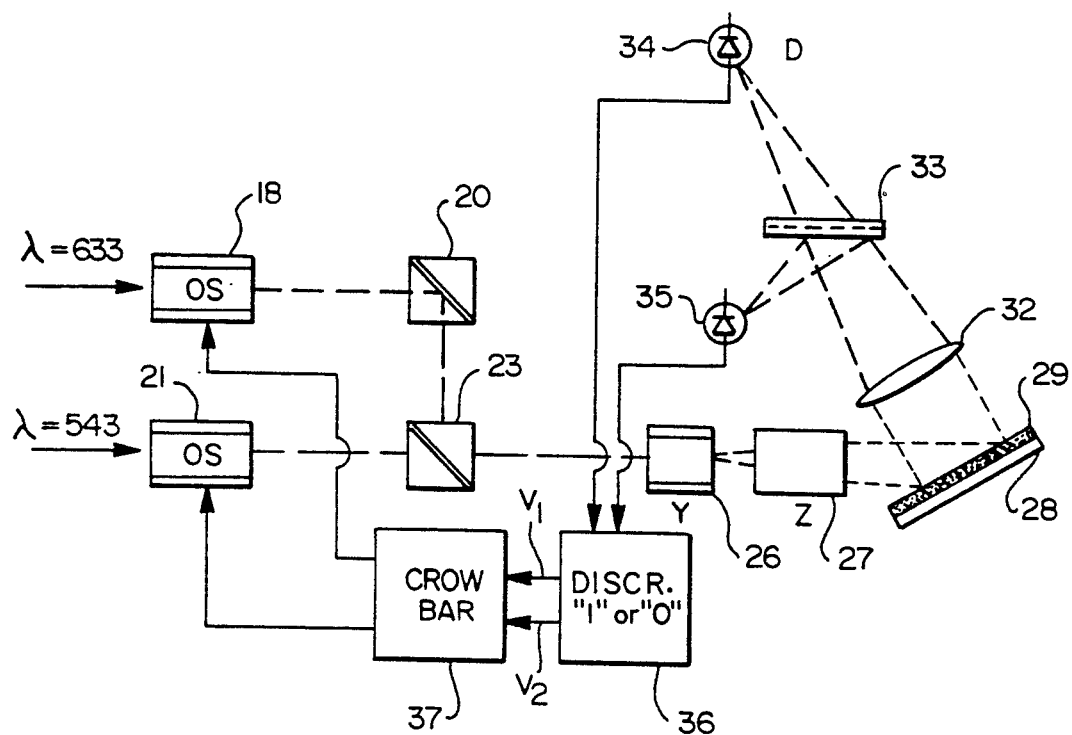
FIG. 2 is a more detailed schematic view of a memory element according to said one embodiment.

Other features of the memory units 11 are shown schematically in FIG. 2. Here elements that are identical with those in FIG. 1 are identified with the same reference number. As indicated here, the photodiodes 34 and 35 have outputs coupled to a discriminator circuit 36 which provides a "1" if the outputs of the photodiodes are indicative of the appropriate population density of bR and K states of the bacteriorhodopsin molecules. Here, a "1" can indicate that the bR population is in excess of about 80% (this can be as high as 97%). Conversely, a "0" output from the discriminator 36 can indicate that the bR population is below 80% (the extreme achievable population density is about 56% bR and 44% K).

A crowbar circuit 37 follows the discriminator 36, and has outputs which are coupled to actuate one or the other of the optical switches 18, 21. After a particular memory cell in the memory plate has been accessed and read using the red and green reading beams, additional light is applied of one or the other wavelength to refresh the particular optical memory cell to its "1" or "0" state. That is, if a "0" state is discriminated, the crowbar circuit 37 will hold the switch 18 on for a brief period of time after reading to push that cell deeper to the "0" state. On the other hand, if a "1" state is read, the crowbar circuit will hold the optical switch 21 on for a brief period, to push the memory cell deeper into the "1" state.

Figure 3:
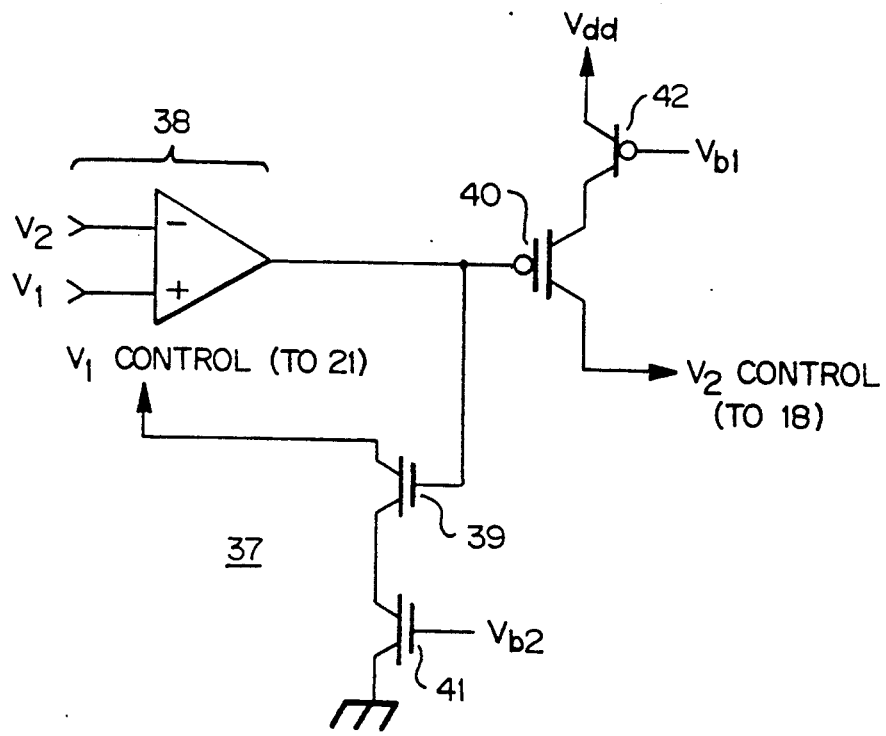
FIG. 3 is a simplified circuit diagram of a portion of the memory element of FIG. 2.

The crowbar circuit 37 can be of any well-known design, and a typical circuit is shown in FIG. 3. Here, a comparator 38 has a pair of inputs coupled to receive output voltages $V_1$, $V_2$ from the discriminator 36. An output of the comparator 38 is supplied to a first output transistor 39 that provides a first control voltage $V_1$ to the optical switch 21, and to a second output transistor 40 that provides a control voltage $V_2$ to the optical switch 18. Regulating transistors 41, and 42 are associated with the two output transistors 39 and 40 and are controlled by regulating voltages $V_{b1}$ and $V_{b2}$.

For a write operation only switch 18 or switch 21 is opened, and the bits "1" or "0" as appropriate are written into the respective memory cells.

Figure 3A:
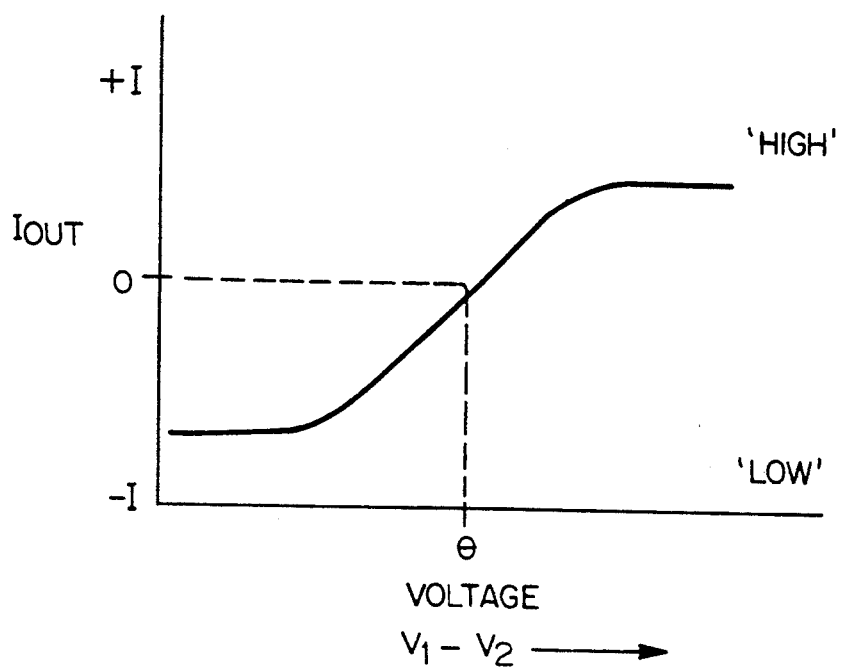
FIG. 3A is a typical characteristic curve for the circuit depicted in FIG. 3.

FIG. 3A shows a typical output characteristic of the crowbar circuit 37 of FIG. 3, which has generally flat high and low output current characteristics and a gradual transition characteristic.

Figure 4:
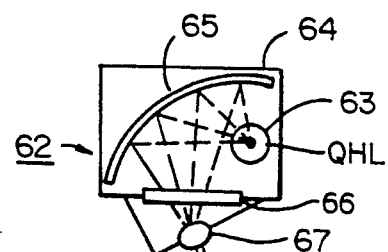
FIG. 4 is a schematic view of a memory element according to another embodiment of this invention.
Figure 4:
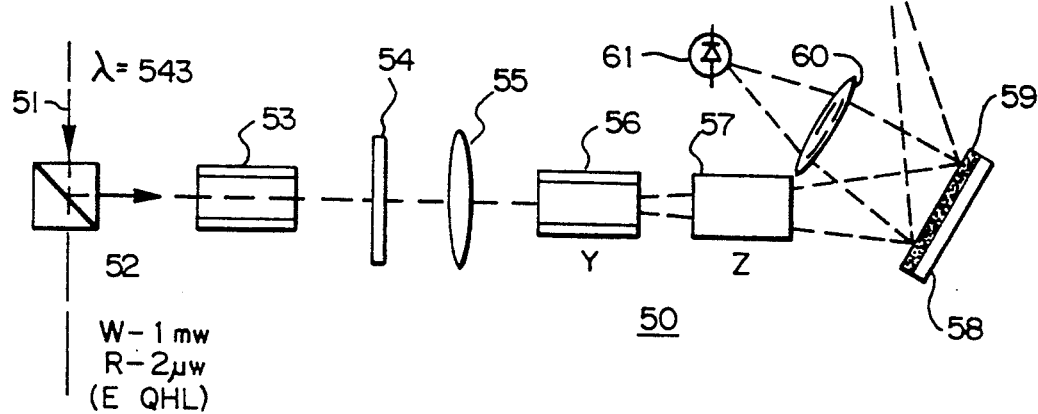

Another embodiment of this invention, which is suitable for use at higher temperatures, i.e. 200 K or higher, is shown in FIG. 4. Here, a single memory unit 50, is illustrated schematically, but it is understood that a memory system would comprise a multiple of these memory units 50, typically thirty-six units, each linked to a common laser bus 51 carrying light of a desired wave length, i.e. 543 nm. For each memory cell the memory unit reads or writes with green light (i.e. 543 nm) and erases using blue light (i.e., 420 nm). A partially reflecting prism 52 extracts a suitable fraction of the light from the laser bus 51, i.e., approximately 1 mw for a write operation and approximately 2 $\mu$w for a read operation. The light is diverted by the prism 52 along a path that includes an electro optical switch 53, a filter 54, a focusing lens 55, and Y and Z electro-optical scanners 56 and 57. The laser beam is steered by the scanners 56, 57 in two orthogonal directions to addressable memory cells on a memory element. This element includes a reflective plate which contains a layer of bacteriorhodopsin or another suitable photochromic substance. Light reflected from the plate 58 is focused by a lens 60 onto a detecting photodiode 61.

An erase lamp assembly 62 has a quartz-halogen lamp 63, with a filtered wavelength of about 420 nm, disposed within a housing 64. A lamp 63 is at one focus of a confocal mirror or similar reflector 65, which directs the blue light through a slit 66. The blue light radiates onto the film layer 59.

For a writing operation, the laser beam is employed at full intensity, i.e. about 1 mw per unit 50, but for a reading operation the laser beam is employed at 0.2% of full intensity, i.e. about 0.002 mw. For an erase operation, the lamp 63 is turned on for a suitable period of time, e.g. up to one minute.

In this embodiment, the memory cells in the photochromic film layer 59 are refreshed periodically by conducting an erase operation followed by a write operation, although each of the memory cells can be read several hundred times without significant degradation.

In each of these embodiments, the response time for the photochromic material is extremely fast, and the access time is limited by the response times of the electro-optical scanners 26, 27 or 56, 57. In either case, the response time is of the order of 20 nsec or faster. Memory systems that employ the principles of this invention are also extremely stable, as they are not subject to static electricity, magnetic fluctuations, or line power fluctuations.

While the present invention has been described in detail with reference to certain preferred embodiments, it should be understood that this invention is not limited to those precise embodiments; rather, many modifications and variations would present themselves to those with skill in the art without departing from the scope and spirit of this invention, as defined in the appended claims.

What is claimed is:

1. An electro optical memory arrangement which comprises a source of light at a first predetermined wavelength $\lambda_1$; an optical switch for selectively passing the light at said first wavelength along a predetermined optical path; a photochromic memory plate positioned across said optical path and having a multiplicity of memory cells thereon in an array disposed in two orthogonal directions, said plate carrying a stabilized film of bacteriorhodopsin whose molecules assume a first, ground state under influence of light of a given second wavelength $\lambda_2$ and assume a second, excited state under influence of light of said first wavelength $\lambda_1$, said bacteriorhodopsin absorbing a relatively high amount of the light of said first wavelength when in said first state and a relatively low amount of the light of said first wavelength when in said second state; optical beam steering means disposed on said optical path in advance of said photochromic memory plate for selectively deflecting said light of said first wavelength on said optical path to a selected one of said memory cells; photodetector means in said optical path after said photochromic memory plate sensitive to light of said first wavelength $\lambda_1$ and producing an output which is of one binary sense or of an opposite, complementary binary sense depending on the strength of light of said first wavelength $\lambda_1$ reaching said photodetector means from said selected memory cell; means controlling the strength of the light from said source to pass the light of said first wavelength $\lambda_1$, at a greater strength for a write cycle and at a significantly lesser strength for a read cycle; and reset illumination means for controllably illuminating the memory plate with light of said second wavelength $\lambda_2$, to set said memory cells into said first state.

2. An electro optical memory arrangement according to claim 1 wherein the light of said first wavelength is red light and said light of said second wavelength is blue light.

3. An electro optical memory arrangement according to claim 2 wherein said strength controlling means provides said light of said first wavelength at a strength of substantially two microwatts for a read operation.

4. An electro optical memory arrangement according to claim 1 wherein said reset illumination means includes a quartz halogen lamp.

5. The electro optical memory arrangement according to claim 1 wherein said reset illumination means is operative to illuminate all of said memory cells simultaneously to set all said memory cells into said first, ground state.

6. The electro optical memory arrangement according to claim 1 wherein said reset illumination means includes means to direct the light of said second wavelength $\lambda_2$ to a selected one of said memory cells to set same into its first, ground state.

7. The electro optical memory arrangement according to claim 6 wherein said reset illumination means includes a helium neon laser that provides a beam of light of said second wavelength.

* * * * *